United States Patent [19]

Underhill

[11] Patent Number: 4,463,308
[45] Date of Patent: Jul. 31, 1984

[54] R.F. IMPEDANCE DETERMINATION

[75] Inventor: Michael J. Underhill, Horsham, England

[73] Assignee: U.S. Philips Corporation, New York, N.Y.

[21] Appl. No.: 263,452

[22] Filed: May 14, 1981

[30] Foreign Application Priority Data

May 20, 1980 [GB] United Kingdom ............... 8016575
Apr. 13, 1981 [GB] United Kingdom ............... 8111625

[51] Int. Cl.$^3$ .......................................... G01R 27/00
[52] U.S. Cl. ................................................ 324/57 R
[58] Field of Search ................ 324/57 R, 57 Q, 57 SS

[56] References Cited

PUBLICATIONS

MAEDA, "An Automatic, Precision 1 MHZ Digital LCR Meter", hp Journal, Mar. 1974, pp. 2–9.

Primary Examiner—Stanley T. Krawczewicz
Assistant Examiner—Jose M. Solis
Attorney, Agent, or Firm—Thomas A. Briody; William J. Streeter

[57] ABSTRACT

To derive information about the R.F. impedance ($Z_t$) presented at a port (P) of an electrical network including a source of R.F. signals (for example, an antenna and an antenna tuning unit) without requiring an additional source of R.F. signals, a circuit is coupled to the port (P) successively in two different states. This circuit comprises auxiliary network means ($N_1$, $N_2$) and radio indicating means such as a radio receiver (Rx); in the two states, it presents at the port (P) different respective impedances ($Z_1$, $Z_2$) and has between the port (P) and the receiver (Rx) different gains ($A_1$, $A_2$), the values being selected so that there is no difference between the amplitudes and/or phases of the signals reaching the receiver (Rx) when said R.F. impedance ($Z_t$) lies on a respective locus in the complex impedance plane. The loci may for example be defined so as to intersect at a point representing an impedance with which it is desired to equate said R.F. impedance ($Z_t$). By switching the circuit alternately to one state and the other, amplitude demodulation in the receiver (Rx) can be used to indicate any differences in amplitude and phase. The auxiliary network means may be a hybrid transformer (HT), one port (4) of which is switched between an open-circuit and a short-circuit termination.

12 Claims, 4 Drawing Figures

R.F. IMPEDANCE DETERMINATION

BACKGROUND OF THE INVENTION

The invention relates to a method of deriving information of the R.F. impedance presented by an electrical network at a port thereof, the network including a source of R.F. signals. The invention further relates to an arrangement for deriving such information.

The network may be the combination of an antenna and an antenna tuning unit, the antenna tuning unit having two ports one of which is connected to the antenna (which acts as the source of R.F. signals) and information being desired of the impedance presented by the combination at the other port; the invention may be used in matching the antenna to a radio receiver or transmitter.

Methods and arrangements for performing such matching are well known. For example, U.S. Pat. No. 3,919,644 describes an automatic antenna coupler for matching an antenna to a transmitter wherein the current and voltage components of signals in a line connecting the transmitter to a matching network and thence to the antenna are sensed by a pickup so as to detect the real part of the impedance or admittance presented to the transmitter and thereby to control the matching network: the signals in the line result from the R.F. energy supplied by the transmitter. U.K. Patent Specification No. 1,565,166, corresponding to U.S. Application Ser. No. 021,760, filed Mar. 19, 1979 now U.S. Pat. No. 4,283,794 describes a process wherein R.F. impedance information of a network is derived by injecting an R.F. current and an R.F. voltage with respective transducers and detecting resultant signals with a radio receiver: if the network is the combination of an antenna and an antenna tuning unit, this information may be used in matching the antenna to a radio receiver or transmitter.

SUMMARY OF THE INVENTION

It is an object of the invention to provide a method and an arrangement as set forth in the opening paragraph which enable R.F. impedance information to be derived using radio indicating means of adequate sensitivity to respond to R.F. signals from said source (and provided the signal-to-noise ratio is also adequate) and which do not necessitate the use of any further source of R.F. signals.

According to a first aspect of the invention, a method as set forth in the opening paragraph comprises coupling to said port successively in two different states an arrangement comprising radio indicating means and auxiliary network means, in each of which states an auxiliary network of the auxiliary network means is in series between said port and the radio indicating means, and in which states the impedance presented by the arrangement at said port has different first and second values, respectively, and the gain provided between said port and the radio indicating means by the cascaded auxiliary network has different first and second values, respectively, and using the radio indicating means to indicate any difference between the respective values in the two states of at least one of the two parameters, amplitude and phase, respectively, of the signal supplied to the radio indicating means relative to a signal of reference amplitude and phase supplied to said arrangement by the source, a locus of zero difference between the values of each parameter being defined in the complex impedance plane for said R.F. impedance of the network by selecting the four quantities respectively constituted by said first and second values of impedance and gain.

According to a second aspect, the invention provides an arrangement for deriving information of the R.F. impedance presented by an electrical network at a port thereof, the network including a source of R.F. signals, the arrangement comprising radio indicating means and auxiliary network means, wherein the arrangement is operable to be coupled to said port successively in two different states, in each of which states an auxiliary network of the auxiliary network means is in cascade between said port and the radio indicating means, and in which states the impedance presented by the arrangement at said port has different first and second values, respectively, and the gain provided between said port and the radio indicating means by the cascaded auxiliary network has different first and second values respectively, and wherein the arrangement is further operable to indicate with the radio indicating means any difference between the respective values in the two states of at least one of the two parameters, amplitude and phase, respectively, of the signal supplied to the radio indicating means relative to a signal of reference amplitude and phase supplied to the arrangement by the source, the difference between the values of the parameter being zero on a locus or the respective differences between the values of the two parameters being zero on respective loci, the locus or loci being defined in the complex impedance plane for said R.F. impedance of the network by the selection of the four quantities respectively constituted by said first and second values of impedance and gain.

Said first and second values of impedance and gain may be predetermined or, as an alternative, be selected in use. They may be selected to the extent that a said locus passes through a desired point in the complex impedance plane or, as an alternative, that a said locus at least approximates a boundary of a region of the complex impedance plane representing a condition which it is desired said R.F. impedance should satisfy, for example the condition that the impedance or a parameter dependent thereon should be not less than or not greater than a particular value. Accordingly, where said R.F. impedance of the network is adjustable, the four quantities constituted by said first and second values of impedance and gain being selected so that a said locus at least approximates a boundary of a particular region of the complex impedance plane representing a condition which it is desired said R.F. impedance should satisfy, and the radio indicating means being operable to distinguish between impedances in regions of the complex impedance plane separated by said locus, the method may further comprise adjusting said particular R.F. impedance to bring it within said region. As an alternative, where said R.F. impedance of the network is adjustable, the four quantities constituted by said first and second values of impedance and gain being selected to define two loci, respectively of zero difference between the values of the two parameters such that the loci intersect at a point in the complex impedance plane representing a desired value for said R.F. impedance, the method may further comprise adjusting said R.F. impedance to make any said difference substantially zero for each parameter whereby substantially to equate said R.F. impedance with the desired value.

The radio indicating means preferably comprise a radio receiver. This can provide particularly good sensitivity, while the selectivity of the receiver can be used to exclude unwanted signals (including noise) and can enable information of said R.F. impedance readily to be derived substantially at a selected frequency of interest.

Preferably, the method comprises switching the arrangement alternately to one state and the other, and the radio indicating means is used to indicate any said difference by indicating the presence of at least one of the two modulations, amplitude modulation and phase modulation respectively, in the signal supplied to it. This is particularly suitable for performing the invention with a radio receiver.

The radio indicating means may for example comprise means for deriving an amplitude-demodulated signal from the signal supplied thereto: this can enable it to indicate differences in the values of both parameters, as explained hereinafter. The switching from one state to the other may be performed at a frequency in the audible range, and the amplitude-demodulated signal fed to an audiofrequency reproducer to provide an audible indication.

The method may comprise deriving a demodulated signal in the radio indicating means from the signal supplied thereto and detecting the demodulated signal synchronously with the switching to one state and to other whereby to distinguish between impedances in regions of the complex impedance plane separated by the respective locus.

The method may comprise deriving in the radio indicating means from the signal supplied thereto a signal at an intermediate frequency and deriving therefrom an amplitude-demodulated signal, and further comprise performing the switching at a frequency not substantially more than a quarter of the intermediate frequency bandwidth of the radio indicating means whereby a component of said amplitude-demodulated signal at twice the switching frequency indicates the presence of phase modulation.

The auxiliary network means suitably comprises a hybrid device having four ports, wherein in each state a first port of the device is coupled to said port in the electrical network, a second port is coupled to the radio indicating means and a third port is terminated with a selected impedance, wherein the fourth port is terminated with different respective impedances in the two states, and wherein when said R.F. impedance and said selected impedance satisfy a predetermined condition, the second and fourth ports are isolated from one another. This is particularly simple and compact and is especially suitable when it is desired substantially to equate said R.F. impedance of the combination with a standard value since the selected impedance terminating the third port may then simply be a matched load. As an alternative, the selected impedance may have different respective values in the two states. The different respective impedances terminating the fourth port may be an open-circuit and a short-circuit respectively.

When the invention is applied to the process of matching an antenna to a radio receiver or to a radio transmitter-receiver combination, it has the advantage that during the matching process the receiver is connected to the antenna for radio reception and can thus continue to receive radio transmissions (albeit possibly at a lower level than usual owing to attenuation by passive auxiliary network means) since it is such transmissions which produce in the antenna the signals used to derive the R.F. impedance information; similar considerations apply to the use of the invention in matching a carrier telephone receiver to a cable with an adjustable equalizer.

DESCRIPTION OF THE DRAWINGS

The invention will now be further explained and embodiments thereof described by way of example with reference to the accompanying diagrammatic drawings, in which.

DESCRIPTION OF THE PREFERRED EMBODIMENTS

Figure 1:
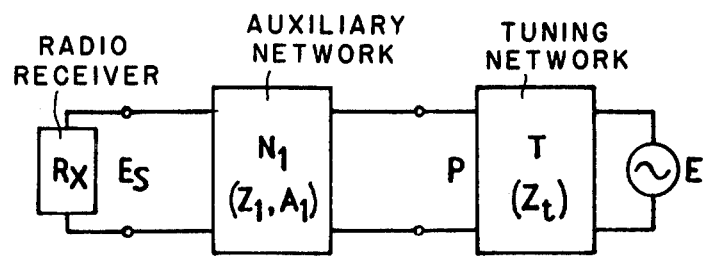
FIG. 1 is an equivalent circuit of a circuit configuration used in embodiments of the invention.

Referring to FIG. 1, an electrical network including a source of R.F. signals, for example an antenna tuning network in series with an antenna, is represented by a two-port network T having a R.F. voltage source E connected across one port and presenting at its second port P an impedance $Z_t$; this is the impedance of which it is desired to obtain information. A two-port auxiliary network $N_1$ has one port connected to the port P of network T, and a radio receiver Rx is connected across its other port so that the network $N_1$ is in cascade between port P of network T and the receiver Rx. This combination of $N_1$ and Rx presents at port P an impedance $Z_1$. The auxiliary network $N_1$ provides between port P and Rx a gain (or transmissivity) $A_1$, which is the case of a passive auxiliary network, will usually be less than unity. The voltage $E_s$ across the receiver Rx is given by $$E_s = E.A_1.Z_1/(Z_t + Z_1) \qquad (i)$$

The radio receiver Rx may be associated with a radio transmitter (not shown).

Figure 2:
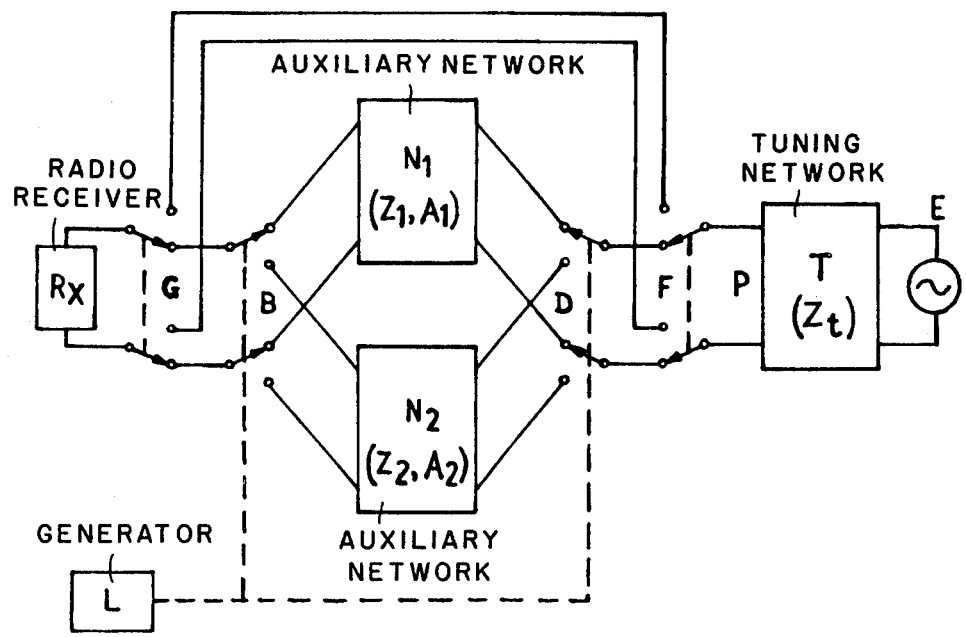
FIG. 2 illustrates a first embodiment of the invention.

FIG. 2 shows an arrangement comprising a pair of auxiliary networks $N_1$ and $N_2$, respectively, and a radio receiver Rx. By means of two electronic or electromechanical switches B and D, the arrangement can be coupled to port P of network T in two different states in which a respective one of the auxiliary networks $N_1$ and $N_2$ is in cascade between port P and receiver Rx, in which the arrangement presents at port P different respective impedances $Z_1$ and $Z_2$, and in which the respective cascaded auxiliary network provides between port P and the receiver different respective gains $A_1$ and $A_2$. The arrangement also includes a generator L which applies a square-wave switching waveform to switches B and D so that the receiver Rx is coupled to port P alternately via one network and then the other.

The signals supplied to the receiver Rx via networks $N_1$ and $N_2$, respectively, will be of equal amplitudes when, from equation (i), $$|A_1 Z_1/(Z_t + Z_1)| = |A_2 Z_2/(Z_t + Z_2)| \qquad (ii)$$

assuming the source voltage to be the same in the two states of the arrangement, as for example when a radio signal of steady carrier amplitude is incident upon an antenna. From this we may write $$|Z_t+Z_1|=|A|\cdot|Z_t+Z_2| \quad \text{(iii)}$$

where $$A=A_1Z_1/A_2Z_2. \quad \text{(iv)}$$

Figure 4:
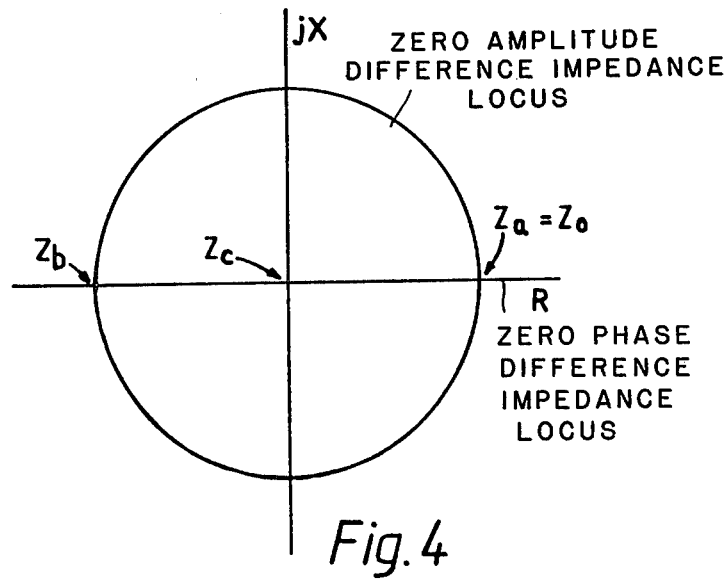
FIG. 4 shows a locus in the complex impedance plane.

The values of $Z_t$ which satisfy equation (iii) lie on a locus in the complex impedance plane (impedances in this plane being defined, for example, with reference to mutually orthogonal axes representing purely real and purely imaginary impedances): in FIG. 4 this locus is a circle with its center on the straight line passing through $Z_1$ and $Z_2$ and intersecting this line at points $Z_a$ and $Z_b$ given by $$Z_a=|A|Z_2-Z_1)/(1-|A|) \quad \text{(v)}$$

and $$Z_b=(-|A|Z_2-Z_1)/(1+|A|); \quad \text{(vi)}$$

the center of the circle being at $$Z_c=(|A|^2Z_2-Z_1)/(1-|A|^2). \quad \text{(vii)}$$

The values of $Z_1$, $Z_2$, $A_1$ and $A_2$ may be selected so that the locus defined by equation (iii) at least approximates a boundary of a region of the complex impedance plane representing a condition which it is desired that $Z_t$ should satisfy: the condition may for example be that $Z_t$, or the real part of $Z_t$, or the conductance corresponding to $Z_t$, or the VSWR resulting from $Z_t$, is not less than or not greater than, a particular value. Where (as here) $Z_t$ is adjustable, it may be desired to adjust $Z_t$ to bring it within said region of the complex impedance plane.

Alternatively or in addition, the values of $Z_1$, $Z_2$, $A_1$ and $A_2$ may be selected so that the point $Z_a$ is at a particular point $Z_o$: from equation (v), the relevant condition is $$|A|=(Z_o+Z_1)/(Z_o+Z_2) \quad \text{(viii)}$$

Furthermore, there will be no difference in the phases of signals supplied to the receiver via networks $N_1$ and $N_2$ relative to a signal of reference phase at the source when, from equations (i) and (iv), $$\arg(Z_t+Z_1)=\arg(Z_t+Z_2)+\arg A \quad \text{(ix)}$$

This equation defines a further locus for $Z_t$ in the complex impedance plane. If $Z_1$, $Z_2$ and $A$ are wholly real and positive, this locus is the real axis in the complex impedance plane and, of course, passes through $Z_1$ and $Z_2$. Thus, if $Z_1$, $Z_2$, $A_1$, and $A_2$ are selected to satisfy this condition and also equation (viii) above, the loci defined by equations (iii) and (ix) will intersect at the point $Z_o$ on the real axis. Hence the impedance $Z_t$ can be equated with $Z_o$ if $Z_t$ is adjusted until the receiver indicates that there is no difference in the amplitudes and no difference in the phases of the signals supplied to the receiver Rx in the two different states of the arrangement.

Whether or not there is any difference in the amplitudes of the signals can readily be indicated by switching the arrangement between the two states by means of the generator L, as shown in FIG. 2, and using the radio receiver to indicate whether there is or is not, respectively, any amplitude modulation at the fundamental switching frequency present in the signal supplied to it, suitably by amplitude-demodulating the signal. If the generator L is set to switch at a frequency in the audible range, the amplitude-demodulated signal may be fed to a sound reproducer (any necessary amplification being provided) so that the presence of amplitude modulation will be indicated by an audible signal which is a reproduction of the fundamental switching frequency.

The sense of any amplitude modulation will depend on which side of the locus defined by equation (iii) the impedance $Z_t$ lies, i.e. in which of the regions of the complex impedance plane separated by the locus the impedance $Z_t$ lies. Impedances on opposite sides of the locus can be distinguished by detecting the amplitude-demodulated signal synchronously with the switching of the arrangement, i.e. when the arrangement is in one and the other state.

Whether there is any difference in the phases of the signals supplied to the receiver in the two states, relative to a reference phase at the source, may be indicated by indicating whether there is any phase modulation present. This too may be done by amplitude-demodulating the signals in the receiver, since although the different phases would not per se result in any difference in amplitude in the two states, the instantaneous change in phase at each moment of switching from one state to the other will cause amplitude variations at twice the switching frequency, which can be detected in the receiver if the switching frequency is less than about one quarter of the intermediate-frequency bandwidth of the receiver. Thus a radio receiver designed to respond only to amplitude modulation may also be used to indicate the presence of phase modulation.

As with amplitude modulation, the sense of any phase modulation will depend on which side of the relevant locus (defined by equation (ix)) the impedance $Z_t$ lies. Impedances on opposite sides of the locus can be distinguished by using a receiver designed to respond to frequency or phase modulation and synchronously detecting the demodulated signal.

Where the electrical network represented by the voltage source E and the network T is an antenna and an antenna tuning unit, the invention being used to match the antenna to a desired impedance at a particular frequency, it will, after performing the matching process, be desirable to connect port P directly to the radio receiver RX (or to an associated radio transmitter) using switches F and G shown in FIG. 2. Where the antenna is to be used with a radio transmitter, $Z_o$ will usually be the output impedance of the transmitter, which impedance may be (but is not necessarily) the input impedance of the receiver.

The port of a network in relation to which R.F. impedance information is derived by the invention need not be a port which constitutes an output port of the network in normal use (as has been indicated above) but may be a port specifically provided within a circuit configuration for the purpose of deriving R.F. impedance information. For example, an antenna tuning unit may be provided with an additional port between two successive reactances of the unit so that the effect of altering the one of those reactances which is between the additional port and the antenna may be more readily ascertained.

Figure 3:
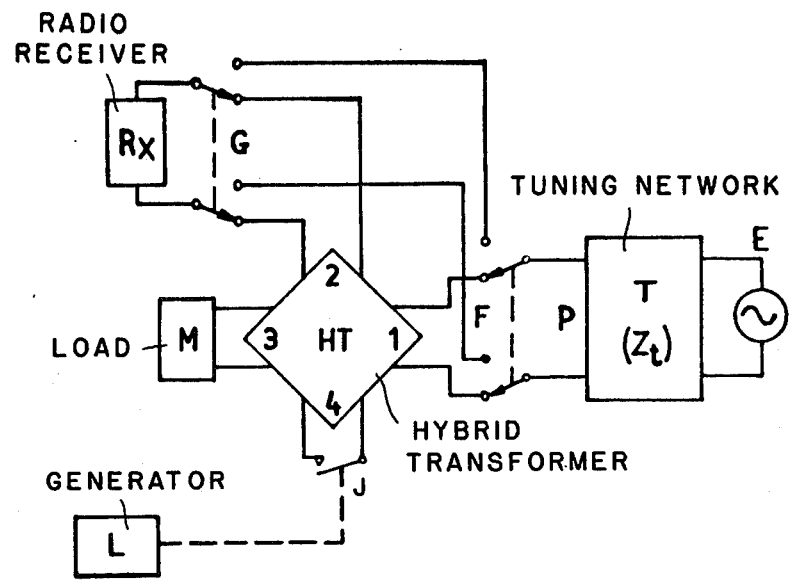
FIG. 3 illustrates a second embodiment of the invention.

FIG. 3 illustrates an embodiment in which an arrangement comprising a four-port hybrid transformer HT and a radio receiver Rx can be coupled to port P of network T in either of two states simply by terminating one port of the hybrid device with two different respective impedances. Port 1 of the device can be coupled to port P via switch F, port 2 can be coupled to the receiver via switch G, port 3 is terminated with a selected impedance, and port 4 is terminated with the two different impedances, respectively, in the two states. In this case, the hybrid transformer is a symmetrical 3 dB type having a characteristic impedance $Z_o$, the selected impedance terminating the third port is a matched load M (for both states of the arrangement) and the two impedances at port 4 are, respectively, an open-circuit and a short-circuit, as determined by a switch J controlled by a square-wave switching waveform from generator L. It may be seen that in this case, when the impedance $Z_t$ presented to port 1 also constitutes a matched load (i.e. has an impedance $Z_o$), ports 2 and 4 are isolated from each other and the variation of the termination at port 4 from one state to the other will not affect the signals supplied to the receiver. More generally, there will be a predetermined condition which the impedances terminating ports 1 and 3 must satisfy for ports 2 and 4 to be isolated from each other.

Analysis of the arrangement of FIG. 3 shows that for the two states, $$Z_1 = Z_o/3$$

$$Z_2 = 3Z_o$$

and $$A = \tfrac{1}{3}.$$

The locus for $Z_t$ in the complex impedance plane for no difference in the amplitudes of the signals supplied to the receiver in the two states is a circle centered at the origin and passing through the point $Z_a = Z_o$, as shown in FIG. 4.

If at least one of the two impedances respectively terminating port 4 in the two states is changed from the values indicated above, the radius and the position of the center of the circle will be altered, but the circle will still pass through the point $Z_o$.

The impedance selected to terminate port 3 may be a single impedance other than a matched load, in which case there will be no differences in the amplitudes and phases of the signals supplied to the receiver when $Z_t$ is the complex conjugate of that single impedance. As a further alternative, the impedance terminating port 3 may have different respective values in the two states: for that purpose, a further switch may be provided at port 3 and be controlled by generator L in synchronism with switch J at port 4.

A hybrid transformer which has been found suitable for the arrangement of FIG. 3 is a broad-band (2–200 MHz) device type THV 50 having a characteristic impedance of 50 ohms, made by ANZAC (a U.S. company). This device includes a matched load terminating one port.

The hybrid device need not be a symmetrical 3 dB type. For example, a device giving unequal power division may give a signal which is weaker than that with a 3 dB type but which is more heavily modulated when at least one of the parameters has unequal values in the two states.

Although embodiments of the invention have been specifically described above with a radio receiver as the radio indicating means, it is possible to use any device which is suitable for indicating any difference in the values of amplitude and/or phase of the signal supplied thereto (relative to a signal of reference a amplitude and phase respectively at the source) in the two different states and which is appropriate to the particular process of indication, e.g. modulation resulting from switching between the two states (as described above) or a direct comparison of the values.

I claim:

1. A method of deriving information of the R.F. impedance presented by an electrical network at a port thereof, the network including a source of R.F. signals; the method comprising:

coupling to said port successively in two different states, an arrangement comprising radio indicating means and auxiliary network means, in each of which states an auxiliary network of said auxiliary network means is in cascade between said port and said radio indicating means, and in which states the impedance presented by the arrangement at said port has different first and second values, respectively, and the gain provided between said port and said audio indicating means by said cascaded auxiliary network has different first and second values, respectively, and indicating, with said radio indicating means, any difference between the respective values in the two states of at least one of the two parameters, amplitude and phase, respectively, of the signal supplied to said radio indicating means relative to a signal of reference amplitude and phase supplied to said arrangement by the source;

wherein the respective differences between the values of said parameters being zero on respective loci, the loci being defined in the complex impedance plane for said R.F. impedance of the network by preselecting the four quantities respectively constituted by said first and second values of impedance and gain.

2. A method as claimed in claim 1, wherein said R.F. impedance of the network is adjustable, the four quantities constituted by said first and second values of impedance and gain being selected so that said locus at least approximates a boundary of a particular region of the complex impedance plane representing a condition which it is desired that said R.F. impedance should satisfy, and the radio indicating means being operable to distinguish between impedances in regions of the complex impedance plane separated by said locus, the method further comprising adjusting said R.F. impedance to bring it within said particular region.

3. A method as claimed in claim 1, wherein said R.F. impedance of the network is adjustable, the four quantities constituted by said first and second values of impedance and gain being selected to define two loci, respectively, of zero difference between the values of two parameters such that the loci intersect at a point in the complex impedance plane representing a desired value for said R.F. impedance, the method further comprising adjusting said R.F. impedance to make any said difference substantially zero for each parameter whereby substantially to equate said R.F. impedance with the desired value.

4. A method as claimed in claim 1, 2 or 3, which comprises switching the arrangement alternately to one state and the other, wherein the radio indicating means is used to indicate any said difference by indicating the presence of at least one of the two modulations, amplitude modulation and phase modulation, respectively, in the signal supplied to it.

5. A method as claimed in claim 4 which comprises deriving a demodulated signal in the radio indicating means from the signal supplied thereon and detecting the demodulated signal synchronously with the switching to one state and the other whereby to distinguish between impedances in regions of the complex impedance plane separated by the respective locus.

6. A method as claimed in claim 4, which comprises deriving in the radio indicating means from the signal supplied thereto, a signal at an intermediate frequency and deriving therefrom an amplitude-demodulated signal, and which further comprises performing the switching at a frequency not substantially more than a quarter of the intermediate frequency bandwidth of the radio indicating means whereby a component of said amplitude-demodulated signal at twice said the switching frequency indicates the presence of phase modulation.

7. An apparatus for deriving information of the R.F. impedance presented by an electrical network at a port thereof, the network including a source of R.F. signals, the apparatus comprising radio indicating means and auxiliary network means, wherein the apparatus is operable to be coupled to said port successively in two different states, in each of which states an auxiliary network of the auxiliary network means is in cascade between said port and the radio indicating means, and in which states the impedance presented by the apparatus at said port has different first and second values, respectively, and the gain provided between said port and the radio indicating means by the cascaded auxiliary network has different first and second values, respectively, and wherein the apparatus is further operable to indicate, with the radio indicating means, any difference between the respective values in the two states of at least one of the two parameters, amplitude and phase, respectively, of the signal supplied to the radio indicating means relative to a signal of reference amplitude and phase supplied to said apparatus by the source, the respective differences between the values of the parameters being zero on respective loci, the loci being defined in the complex impedance plane for said R.F. impedance of the network by the selection of the four quantities respectively constituted by said first and second values of impedance and gain.

8. An apparatus as claimed in claim 7 comprising means for switching the arrangement alternately to one state and the other.

9. An apparatus as claimed in claim 8 wherein the radio indicating means comprises means for deriving a demodulated signal from the signal supplied thereto and for detecting the demodulated signal synchronously with the switching to one state and the other.

10. An apparatus as claimed in claim 7, 8 or 9, wherein the auxiliary network means comprises a hybrid device having four ports, wherein in each state, a first port of the device is coupled to said port of the electrical network, a second port is coupled to the radio indicating means and a third port is terminated with a selected impedance, wherein the fourth port is terminated with different respective impedances in the two states, and wherein when said R.F. impedance and said selected impedance satisfy a predetermined condition, the second and fourth ports are isolated from each other.

11. An apparatus as claimed in claim 10 wherein the selected impedance terminating the third port has different respective values in the two states.

12. An apparatus as claimed in claim 10, wherein the different respective impedances terminating the fourth port are an open-circuit and a short circuit respectively.

* * * * *